United States Patent [19]

Day et al.

[11] 4,272,731

[45] Jun. 9, 1981

[54] THIN FILM RESISTOR MICROWAVE NOISE GENERATOR

[75] Inventors: W. Baldwin Day, Dunedin; Harry F. Strenglein, Clearwater, both of Fla.

[73] Assignee: Sperry Corporation, New York, N.Y.

[21] Appl. No.: 42,489

[22] Filed: May 25, 1979

[51] Int. Cl.³ .......................................... H03B 29/00
[52] U.S. Cl. ...................................... 331/78; 331/70; 333/33; 333/204
[58] Field of Search .......................... 331/78, 69, 70; 455/226; 333/33–35, 204, 238

[56] References Cited

U.S. PATENT DOCUMENTS 3,693,095  9/1972  Wilt ..................................... 331/78 X
3,711,778  1/1973  Day .................................. 333/247 X Primary Examiner—Siegfried H. Grimm
Attorney, Agent, or Firm—Howard P. Terry

[57] ABSTRACT

The invention is a novel noise reference generator for use in amplitude comparison radiometric systems for the purpose of rapid precision control of the over-all gain of the radiometer receiver. The reference generator operates by cyclic modulation of the temperature of a unique planar thin film microresistor which may be disposed in a constant temperature environment. A strip transmission circuit provides a common path for the microresistor heater currrent and for the generated noise signals, along with means for separating these currents.

14 Claims, 9 Drawing Figures

THIN FILM RESISTOR MICROWAVE NOISE GENERATOR

BACKGROUND OF THE INVENTION

1. Field of the Invention

The invention pertains to the art of microwave radiometry using comparison of the amplitude of a signal to be investigated, such as a thermal noise signal, to the amplitude of a locally generated reference signal. The invention more particularly relates to a novel gain control reference generator system for use in an amplitude comparison radiometer receiver for the purpose of precision control of the over-all gain of the receiver, a reference generator operating by cyclic modulation of the temperature of a planar micro-resistor of unique design.

2. Description of the Prior Art

Prior art reference high-frequency noise sources include transmission line terminations and noise generating semiconductor and other diodes, including avalanche diodes, temperature limited thermionic vacuum diodes, and gas discharge devices. Such prior devices suffer various disadvantages, including large size and weight, high power consumption, and excessive cost. Other such devices demonstrate instability in time and temperature, general unsuitability for use at millimeter wave lengths, and lack of flexibility. Certain of the devices produce an output changeable in amplitude only slowly or by only a small percentage. The prior art devices, especially those imitating prior art planar infrared sources, have excessively high thermal capacity and are difficult to match efficiently in microwave circuits.

One of the relatively attractive noise reference sources of the prior art is that of the R. E. Wilt U.S. Pat. No. 3,693,095 for a "Radiometer Gain Control Reference", issued Sept. 19, 1972 and assigned to Sperry Rand Corporation. In the Wilt patent, the noise reference signal is generated by the square wave modulation of a fine heated wire whose electromagnetic noise energy spectrum is coupled into the path of the primary radiometer signals. Modulation is effected by causing a bridge circuit including the heated wire in one of its arms to become cyclically rebalanced in a square wave manner.

Wilt's heated wire device is smaller than other prior art devices except the semiconductor noise diode, but the output of the latter unpredictably varies with ambient temperature. Further, the heated wire device consumes less power than is consumed in the controlled heating of transmission line terminations. The heated wire device is useful at frequencies higher than the useful range of the vacuum diode. The gas discharge tube suffers in comparison because of its size, high voltage, and high current requirements.

SUMMARY OF THE INVENTION

The invention is a novel noise reference generator for use in amplitude comparison radiometric systems for the purpose of rapid precision control of the over-all gain of the radiometer receiver. The reference generator operates by cyclic modulation of the temperature of a unique planar thin film micro-resistor which may be disposed in a constant temperature environment. A strip transmission circuit provides a common path for the microresistor heater current and for the generated noise signals, along with means for separating these currents. The microresistor may be disposed on a heated substrate, controlled at a constant temperature level. The matched design of the microresistor and its associated high frequency circuit is such as to permit rapid, high-frequency changes of the microresistor temperature between fixed values, permitting the receiver to hold an accurate and constant calibration.

In the invention, the effective ambient temperature is held constant, thus permitting the noise generator temperature and the rate of change of the latter to be stabilized and independent of environmental conditions. The fine wire system of Wilt, however, suffers in that the rate of change of its temperature is an uncontrollable function of the varying ambient temperature, of atmospheric pressure, and of acceleration, vibration, and attitude, problems eliminated by the present invention. The thermal time constant of the present microresistor is reduced, permitting higher modulation frequencies and permitting the higher radiometric data rates. Fabrication of the novel reference noise gain control generator is simplified with respect to the Wilt device, permitting lower cost of manufacture and higher reliability. In particular, manufacture employs the same inexpensive techniques that are generally employed in fabricating microwave integrated devices for the radiometer art.

DESCRIPTION OF THE PREFERRED EMBODIMENTS

Figure 1:
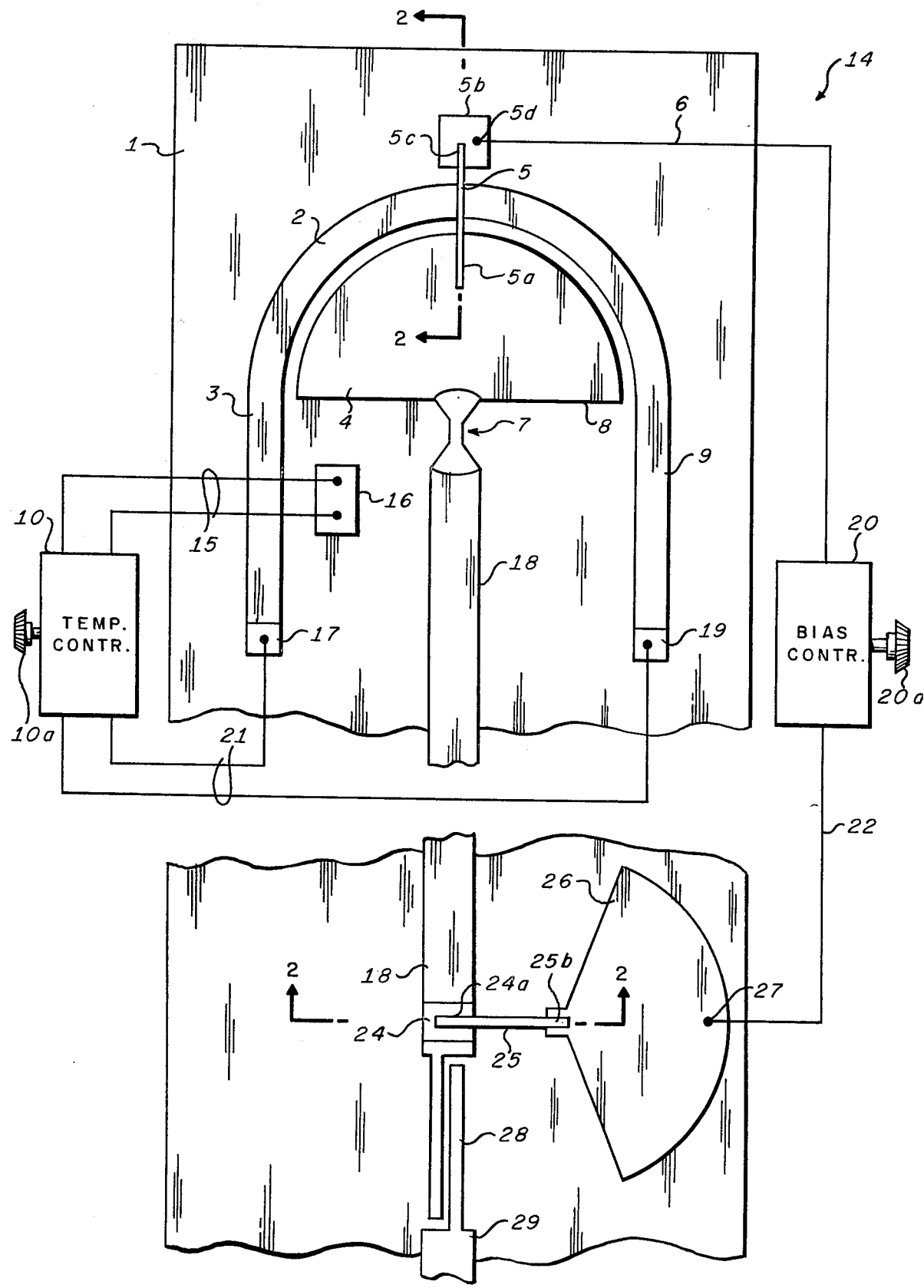
FIG. 1 is a plan view of the novel stable radiometer gain control reference device showing its electrical components and their electrical interconnections.
Figure 2:
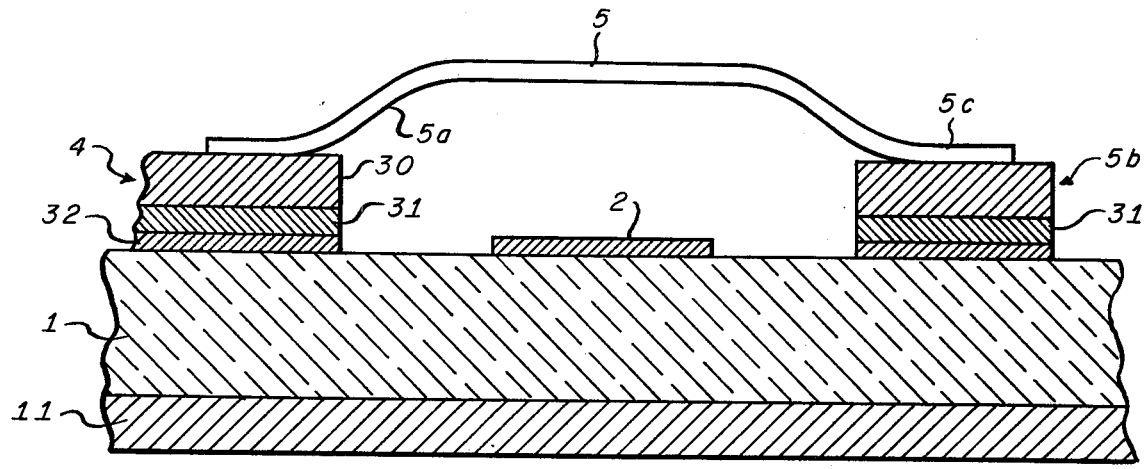
FIG. 2 is a cross-sectional view taken at the line 2—2 in FIG. 1.

Referring to FIGS. 1 and 2, the novel microcircuit device 14 is shown in planar transmission line form, the transmission line itself consisting in part of a copper or other electrically conductive metal ground plane 11 and a dielectric substrate 1, which latter may be constructed of aluminum oxide, fused silica, ferrites, or other similar ceramic dielectric materials and which is permanently affixed to a surface of the ground plane conductor 11. The transmission line system further includes elements which may be made in part of the same or similar conductive materials affixed to an upper surface of insulating substrate 1. The microwave transmission line elements, including the half-circular capacitive plate 4, strip transmission line 18, the series direct current blocking capacitor 28, strip transmission line 29, and capacitor plate 26 of the upper surface conductor system may be formed in a generally conventional manner by being bonded by evaporation of metal in a vacuum chamber through a suitable mask onto the free upper surface of substrate 1. In the present instance, it is preferred first to evaporate a thin layer of tantalum, for example, through the mask onto the substrate, since tantalum forms an excellent bond to dielectric materials such as alumina. Tantalum is employed because it is one logical choice for forming the thin film noise microresistor 7 yet to be discussed in detail; the tantalum film is indicated at 32 in FIG. 2. Other materials may be substituted for tantalum, such as rhodium, chromium, titanium, or platinum or alloys thereof. In any event, a relatively thick layer 31 of gold is then vacuum evaporated through a similar mask except over microresistor 7, the gold forming a firm bond to the initial tantalum layer 32 and affording a highly conductive surface even for high frequency and microwave currents. Silver or other good electrical conductors may be used in place of gold and other known processes may be used for forming the transmission line elements. It will readily be recognized by those skilled in the art that the dimensions and proportions used in the drawings are not necessarily those which would be used in practice, and that proportions have been distorted in the drawings for the purpose of clearly illustrating the invention and because some of the films illustrated, for instance films 31 and 32 in FIG. 2, as having considerable thickness are in fact nearly vanishingly thin. In one example, the tantalum film 32 thickness was 0.0000004 inches and of the gold layer 31 thickness was 0.0005 inches.

A temperature bias generated by means of a control current is to be applied through thin film noise resistor 7 in operation, so that means for coupling that current into the mircrocircuit of FIG. 1 are provided without interference with the primary function of noise microresistor 7. The temperature bias signal is supplied by bias control 20, adjustment 20a determining the characteristics of its output pulse train current, as will be further described. The bias circuit is completed by leads 6 and 22, lead 6 being bonded, as by thermal compression bonding, to a raised gold terminal 5b at 5d opposite capacitor plate 4. The raised gold terminal 5b, like the similar terminal 24, is formed on top of gold film 31 as seen at 30 in FIG. 2 by electrodeposition, the remainder of the circuit being protectively masked. A bridging wire 5 is bonded to terminal 5b and at its other end 5a at the central part of the half-circular edge of capacitor plate 4. In this manner, the bias current from control 20 is conveyed by lead 6 to terminal 5b through the looped gold wire 5 to contact 5a on capacitor plate 4, the looped wire 5 and plate 4 forming a low pass filter in cooperation with ground plate 11. The control current thus flows through noise resistor 7 and transmission line 18 to a raised terminal 24 similar to terminal 5b. Here, it passes through the looped inductive wire 25, bonded to terminal 24 at 24a and to the apex of capacitor plate 26 at contact 25b. The looped wire 25 cooperates with capacitor plate 26 and ground plate 11 to form a second low pass filter, providing a low frequency current path that returns to bias control 20 through contact 27 and lead 22. The looped wire 25 is generally similar to looped wire 5 of FIG. 2, except that heater arc 2 is absent. The series capacitor 28 provides a d.c. block in transmission line 18-29, so that low frequency or direct current signals are restricted to flow back to control 20, while high frequency signals may propagate through capacitor 28 and line 29 into the radiometer receiver. The filter formed by the impedance of looped wire 5 and capacitor plate 4 insures that high frequency currents cannot propagate into lead 6 so that all such currents, in effect, can flow only in the transmission line upper conductors 18, 28, and 29 and in the ground plate 11 in the general manner described in the W. B. Day U.S. Pat. No. 3,711,778 for a "Microwave Microcircuit", issued Jan. 16, 1973 and assigned to Sperry Rand Corporation.

In order to stabilize the operation of noise resistor 7, a strip heater having legs 3 and 9 and an intermediate arcuate portion 2 is provided in close proximity to the circular arc forming one side of capacity plate 4 as a means for raising the temperature of substrate 1 to a predetermined level, substantially enclosing noise resistor 7 and thereby permitting it to reside in a constant ambient temperature environment in one embodiment of the invention. Conventional constant temperature control means may be used, including a temperature responsive diode 16 or other such sensor, input leads 15, controller 10 with an adjustment 10a for preselecting the actual operating temperature, leads 21, and heater terminals 17, 19. Terminals 17, 19 may be constructed of gold, in the same manner as terminals 5b and 24, at the ends of the heater strip, the tantalum heater being laid down at the same time that the tantalum film 32 of the microwave circuit is formed and in the same general manner. Temperature controller 10 may include a conventional temperature reference circuit adjustable at the will of the operator by adjustment 10a. The temperature as sensed by diode 16 in the form of a current or voltage is compared to the predetermined output of the temperature reference circuit to develop a control signal causing heater 2, 3, 9 to hold at the selected constant temperature.

While the prior art illustrates temperature controls useful for this purpose, one suitable device is taught in the W. B. Day et al U.S. patent application Ser. No. 934,918 for "Temperature Control Apparatus", filed Aug. 18, 1978, assigned to Sperry Rand Corporation, and now abandoned. The Day et al application provides apparatus for controlling the temperature of circuit elements mounted on an insulating substrate in which the temperature of the substrate is controlled by raising it above an ambient level, the temperature being maintained at the preselected level by the temperature control circuit 10. The voltage reference circuit of the temperature controller 10 of FIG. 1 may also be located upon the substrate 1, as suggested in the Day et al application, so that the voltage reference circuit itself may be maintained at a substantially constant temperature. A useful insight into the nature of the invention may be gained from the realization that, in a typical example, microresistor 7 has dimensions that are substantially 0.001 inches by 0.003 inches, with a thickness of 0.0000004 inches, and the size of the substrate 1 for the assembly is typically 0.140 inches by 0.200 inches, with a ground and polished thickness of 0.013 inches.

Figure 3:
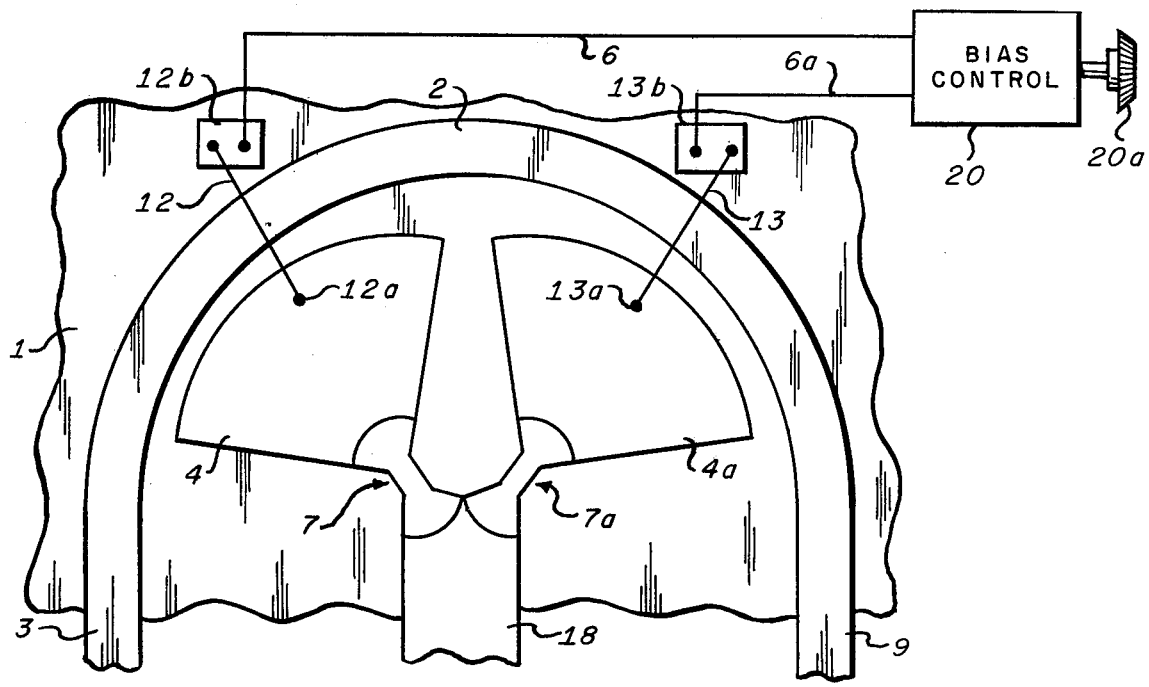
FIG. 3 is a partial plan view of an alternative portion of the invention which may be substituted within FIG. 1.

FIG. 3 represents an alternative configuration mounting a pair of microresistors 7, 7a in a geometrically more balanced circuit simplified by eliminating the need of the blocking capacitor 28, inductive lead 25, and capacitor plate 26 of FIG. 1. Strip transmission line 18, heater elements 2, 3, 9, bias control circuit 20, and dielectric substrate 1 are similar to corresponding elements in FIG. 1. In FIG. 3, the pair of similar microresistors 7, 7a is arranged in parallel at the end of strip line 18 to terminate it, each having double the microwave impedance of line 18. Furthermore, each is serially connected to its respective capacitive plate 4, 4a. The raised gold terminals 12b, 13b on substrate 1 are formed similarly to terminal 5b of FIG. 1. The circuit from bias control 20 is completed via lead 6, terminal 12b, the bridging inductive lead 12, contact 12a, and capacitor plate 4, thin film microresistors 7, 7a, capacitor plate 4a, contact 13a and bridging inductive lead 13, terminal 13b, and lead 6a. Thus, microresistors 7, 7a are connected in parallel with the strip transmission line 18, but in series with respect to the bias control 20.

Figure 6:
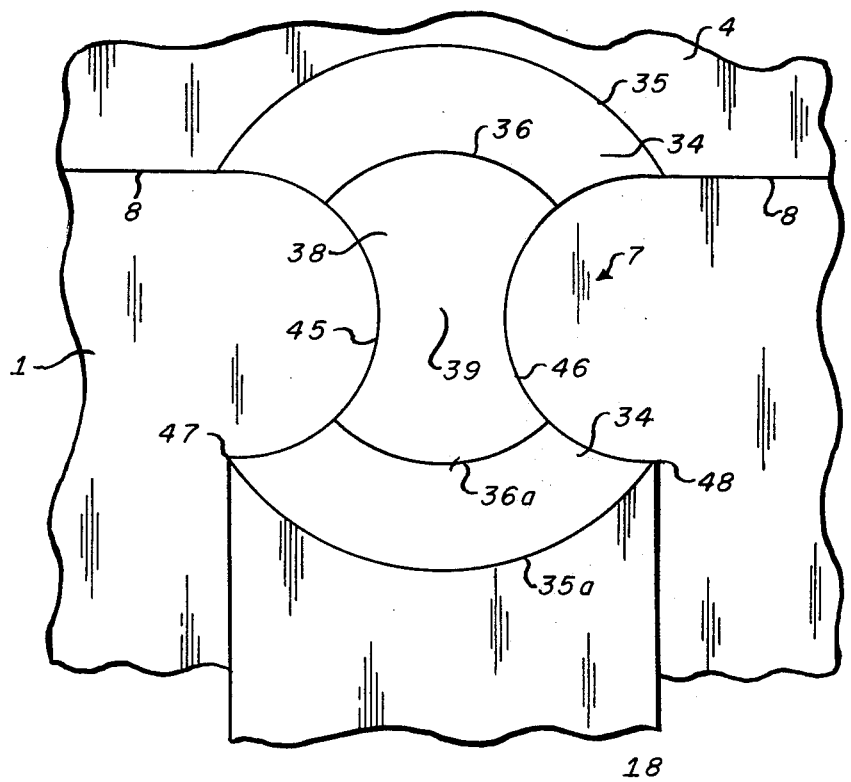
FIG. 6 is a plan view of an alternative to the construction shown in FIG. 4.
Figure 4:
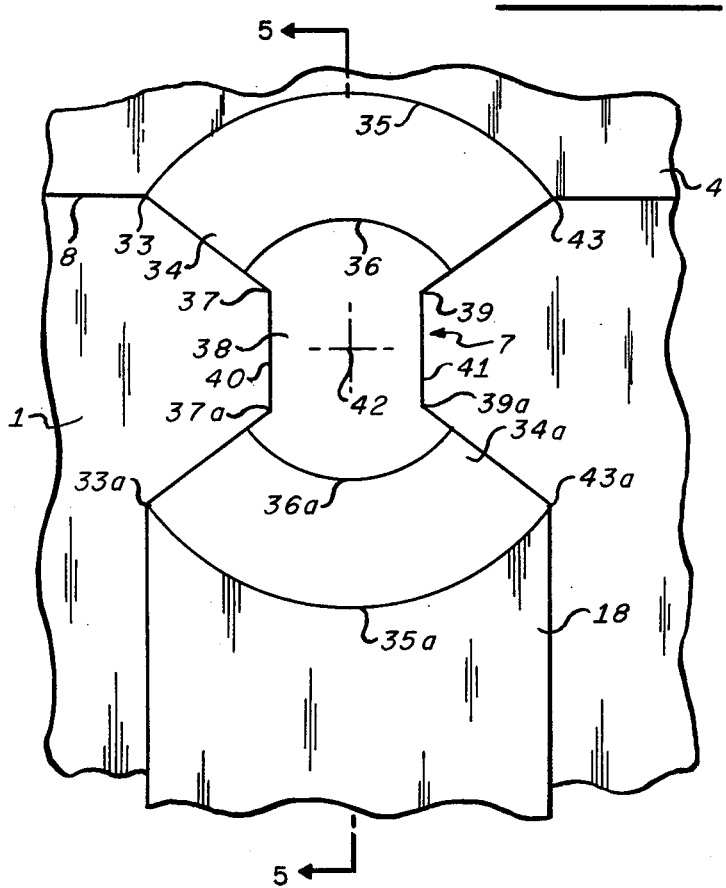
FIG. 4 is a detailed plan view of a portion of FIG. 1.
Figure 5:
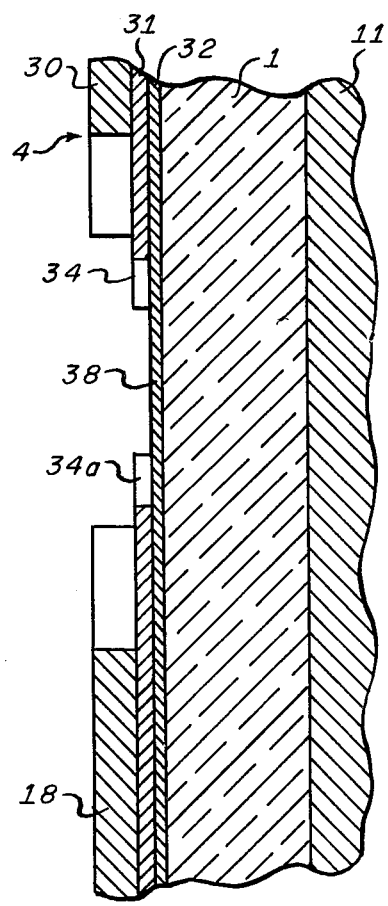
FIG. 5 is a cross-sectional view taken along the line 5—5 of FIG. 4.

Preferred forms of the microresistor 7 may be discussed in further detail with respect to FIGS. 4, 5, and 6. Considering first the form shown in FIGS. 4 and 5, it is seen that the microresistor 7 includes a central generally rectangular region and two oppositely flared end regions. It is also seen that the uppermost electrical conducting layer 30 forms the top surface of capacitive plate 4 and the opposed strip line 18. Centered in the lineal side 8 of capacitor plate 4 is a concave arcuate boundary 35 which may be a portion of a circle, a similar concave boundary 35a being found in the end of transmission line 18. The next lower thin conductive film layer 31 directly underlies capacitor plate 4 and transmission line 18 and has opposed conducting matching portions 34, 34a spaced from but extending toward each other from arcuate boundaries 35, 35a. The matching elements 34, 34a appear as arcuate sectors; for example, portion 34 shows opposed concentric arcuate sides 35, 36 and opposed converging linear sides between pairs of intersections 33, 37 and 43, 39. Portion 34a appears to have opposed arcuate sides 35a, 36a and opposed converging lineal sides between pairs of intersections 33a, 37a and 39a, 43a. The lines 33–37, 33a–37a, 39–43 and 39a–43a, if extended, would meet at the geometric center 42 or substantially at that point, though the exact disposition of the sides with respect to central point 42 is not highly critical. In the exposed matching sections 34, 34a, the gold film 31 may be of constant thickness or, with somewhat greater manufacturing complexity, it may be tapered in thickness to a minimum at arcuate boundaries 36, 36a.

The tantalum layer 32 next below gold layer 31 extends continuously in the direction of signal flow over the surface of substrate 1 as shown in FIGS. 4 and 5. Film 32 everywhere underlies capacitor plate 4 and strip transmission line 18 and is symmetric in shape about line 5—5. The active and exposed resistor portion 38 of film 32 is bounded by the opposed parallel sides 40, 41 and by the arcuate boundaries formed at 36, 36a. Active resistor portion 38 may be further bounded by the opposite diverging borders intersecting side 40 at respective intersections 37, 37a and by further opposite diverging sides intersecting side 41 at intersections 39, 39a. The tantalum film 32, it is seen, extends continuously from its portion forming active microresistor 38 to those underlying capacity plate 4 and transmission line 18 so as also to form its portions underlying the electrical conductors of the arcuate matching sectors 34, 34a.

The following dimensions in inches were employed in one example of apparatus made according to FIGS. 4 and 5:

| | |
|---|---|
| radii 42–36, 42–36a | 0.002 |
| radii 42–35, 42–35a | 0.004 |
| lengths 37–37a, 39–39a | 0.001 |
| distance between sides 40, 41 | 0.0014 |
| width strip line 18 | 0.006 |

The corresponding radius (0.037 inches) of capacity plate 4 is determined by the associated receiver local oscillator frequency, while the other dimensions are selected in view both of thermal and electrical considerations. First, the active resistor portion 38 must be so small as to respond rapidly with a low time constant to small changes in input power, whether direct current or radio frequency power. This response is in the form of a change in the resistance of microresistor portion 38 caused by its change in temperature. At the same time, the microresistor portion 38 must be electrically matched to transmission line 18 so that high frequency energy is not reflected at interface 35a, for example. The widths and shapes of the microresistor portion 38 may be altered in the usual way by an electron beam cutting tool, for example, to obtain the optimum configuration experimentally. The shape of the resistor active portion 38 may accordingly be adjusted to change its total resistance without changing the thickness of tantalum films 32 and may readily be matched to the impedance of transmission line 18. For example, it is reliably estimated that the lengths 40, 41 may be varied over a range of one third to three times the aforementioned value 0.0014 inches. That the form of the resistor may be varied is further illustrated in FIG. 6, where the several discrete straight line borders 40, 41 et cetera of FIG. 4 are replaced by a pair of continuous arcuate borders 45, 46.

In order further to explain the special utility of the invention, it is appropriate to discuss its operation in representative prior art radiometer systems. Such a system might be that of the aforementioned R. E. Wilt U.S. Pat. No. 3,693,095, wherein the noise generator system of the present FIG. 1 may replace that of the second figure. Also, it may be used in the somewhat simpler conventional radiometric system of FIG. 7 or otherwise. The Wilt radiometer features elimination of loss of its calibration due to undesired long-term gain changes through the addition of a quadrature modulation signal path in the radiometer receiver as a means of coupling a gain control reference signal into the radiometer receiver. The gain control reference signal is ultimately separated at the output of the radiometer received and provides a feed back signal to correct for undesired receiver gain changes. The gain control reference signal is generated by improved means permitting cyclic modulation of the temperature of the heated fine wire element coupled to the radiometer receiver.

Figure 7:
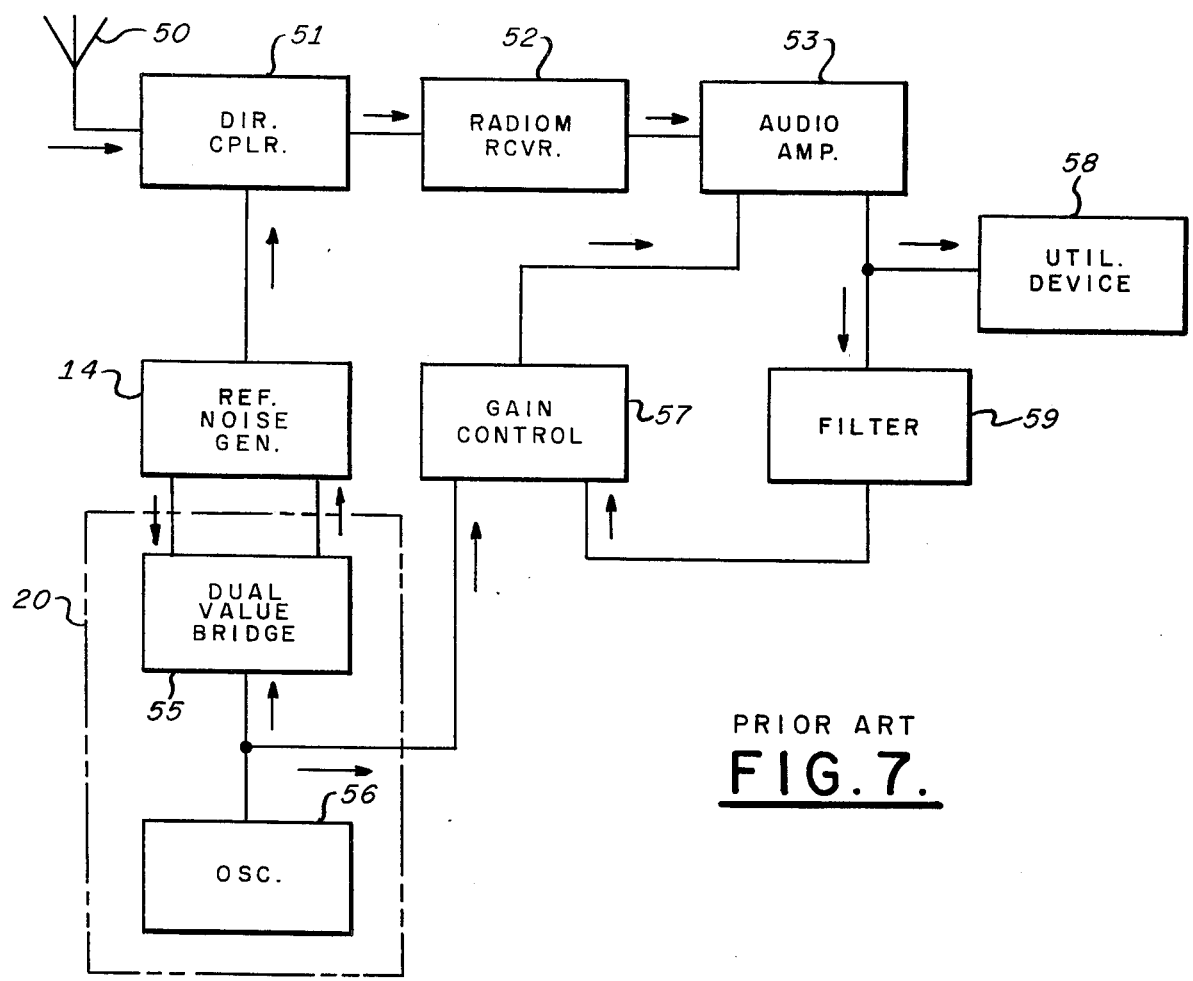
FIG. 7 is a block diagram of a conventional radiometer system in which the invention may be employed, showing electrical components and their interconnections.

In the Wilt system and in the system of FIG. 7, electrical connections such as leads 6, 22 permit the resistance of the active resistor portion 38 to be measured and precisely controlled. The control network relies on a single dual-level Wheatstone bridge 55 of which the thin active portion 38 of the microresistor 7 of reference noise generator 14 is one arm. When the level of direct current passing through microresistor 7 is changed, the amount of power dissipated in the active resistor portion 38 is varied and its temperature is consequently changed. By using a feed back amplifier as in the Wilt patent, the output of the Wheatstone bridge is employed to control the resistance of the thin film resistor active portion 38 by maintaining the bridge in balanced condition. A change made in the resistance of one of the other three arms of the bridge results in a new balance condition for the microresistor active portion 38. In this manner, the Wilt patent provides a means for controlling or modulating the noise power level generated by the microresistor in terms of the resistance of the one other arm of the Wheatstone bridge. Two of the resistors of the bridge are selected for their high stability under varying temperature and other environmental conditions and this selection enables the accurate calibration of the noise power level generated by microresistor active portion 38 of FIG. 1.

In the conventional radiometer system of FIG. 7, signals such as low power, noise-like radio frequency signals commonly associated with thermal radiation, generated by any source to be examined by the radiometer system, are received by antenna 50, which antenna may be any of various known types of broad band microwave or other antennas previously used in the radiometer art. Further, the signals may be generated by any other signal source to be examined and directly inserted. In any event, they are supplied through an input configuration including a directional coupler 51 (whose function remains to be discussed) to a conventional radiometer receiver 52 including a conventional microwave mixer and a local oscillator, such as a semiconductor diode oscillator supplying high frequency signals in the usual manner to the mixer. This event causes mixing of the two input signals, generating a modulated difference-frequency signal in the intermediate frequency spectrum for application to a broad band intermediate frequency amplifier within receiver 52. The mixer output may be amplified and then detected in the usual manner and the resulting noisy direct current audio signal is amplified by narrow band audio amplifier 53 for use by radiometric utilization equipment 58 not necessarily a part of the present invention; but involved, for example, with processing the radiometer output data for such purposes as automatic tracking of an object, thermal mapping of a land area, analysis of a radiation source, or the like.

Figure 8:
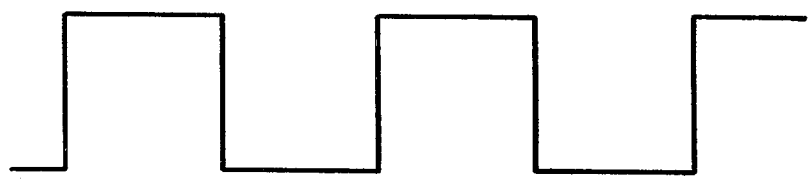
FIGS. 8 and 9 are graphs of wave forms useful in explaining the operation of the invention.

The precision stable oscillator 56 generates the wave train of FIG. 8 for modulation of the resistance of one arm of a dual level bridge as taught with respect to the third figure of the aforementioned Wilt patent. The consequent modulation of the resistance of one arm of the dual-state bridge and the consequent variation in bridge balance is used to cause the temperature of the thin film microresistor in reference noise generator 14 to vary in a corresponding manner. In this manner, the cyclically varying temperature of the microresistor 7 can result in a cyclic variation of the level of the thermal noise signals generated by microresistor 7. Since heater 2, 3, 9 and the temperature control system associated therewith are maintaining constant the thermal environment in which microresistor 7 finds itself, the resulting upper and lower noise levels are maintained substantially constant, being independent of environmental conditions.

A predetermined portion of the pulse modulated noise signal from reference noise generator 14 is coupled by directional coupler 51 into the mixer of receiver 52 along with the signal collected by antenna 50 or from other sources. Both signals are processed as would be expected by radiometric receiver 52 and by audio amplifier 53. Now, the output of audio amplifier 53, in the usual manner, contains two components, a d.c. component due mainly to the antenna input and a cyclic component primarily due to the modulated output of the reference noise signal generator 14 in the well known manner. These components are separated by narrow band filter 59, which is tuned to pass only signals having the same frequency as that injected into the system by oscillator 56. That frequency should be relatively high, so that utilization equipment 58 may follow rapid changes in the input radiometric data (say 3000 Hz).

The output of filter 59 is compared in amplitude to a fixed predetermined portion of the oscillator 56 audio signal in the conventional detector present in gain control 57, thus generating an output gain control voltage. The gain control signal is a unidirectional voltage of level directly proportional to the amplitude of the output of filter 59; when applied to a conventional gain control stage of audio amplifier 53, it in effect modifies the over-all gain of the receiver system in such a way as to correct for any undesired drift of the total receiver gain. Because the output of filter 59 is also a function of the amplitude of the output of reference noise generator 14, it is apparent that generator 14 must be reliably very stable. Thus, the importance of temperature control 10 and of the stable characteristics of microresistor 7 can be appreciated, because they effectively isolate the outputs of reference noise generator 14 from changes in the ambient temperature to which the apparatus is subjected.

To appreciate fully the advantages of the invention, the physical nature and operation of such a prior art radiometric gain control reference system must be understood. As discussed in the foregoing, the microwave noise power generated by the reference noise generator 14 is precisely controlled through control of one of its resistance arms by a cooperating bridge circuit. But the precise control is extant only when the bridge is actually in a balanced state. During the cyclic transition times in which microresistor 7 is being heated or cooled, its temperature is not, in fact, being controlled and will be significantly and adversely affected simultaneously by the level of the ambient temperature, atmospheric conditions, attitude, and acceleration. Any other factor which affects the heating or cooling rate of microresistor 7 must affect its temperature during the switching interval.

Figure 9:
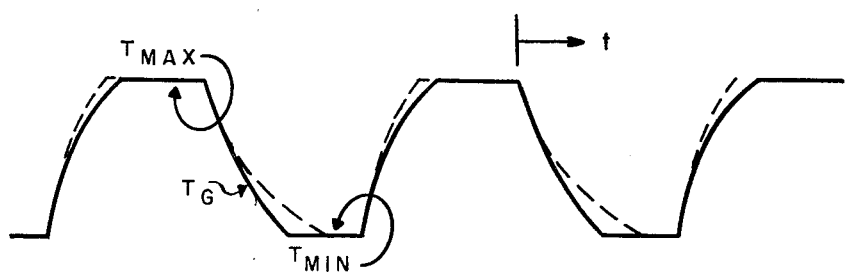

The transient heating effect is shown in FIG. 9 and the relationship is expressed by the following:

$$T_G = T_{MAX} - (T_{MAX} - T_{AMB})(1 - e^{\frac{-t}{\tau}})$$

where:
$T_G$ is the temperature of the active portion of noise generator resistor 7 during the cooling period, for instance,
$T_{MAX}$ is the highest reference temperature,
$T_{AMB}$ is the temperature of the heat sink or substrate 1 to which the resistor 7 is thermally coupled,
t is time from the start of a cooling episode, and
$\tau$ is the thermal time constant of resistor 7.

In the case of the heated wire of the Wilt patent, radiation is a minor and negligible effect. Unless placed in a sealed enclosure, the time constant $\tau$ of Wilt's wire is a strong function of atmospheric conditions, some 90 percent of the cooling of the fine wire being via the convection mechanism. Therefore, the slope of the temperature $T_G$ during cooling is affected by both the ambient temperature $T_{AMB}$ and the time constant $\tau$, even if the values of $T_{MAX}$ and $T_{MIN}$ may have been coerced to remain constant by the use of the temperature control system 10 of the present FIG. 1. With the total construction used in the invention, $T_{MAX}$ and $T_{MIN}$ are held constant by the temperature control 10 of FIG. 1 and cooling is some 95 percent by conduction. Both convection and radiation are minimized in the microresistor system of the present FIGS. 1, 4, 5, and 6, so that the thermal time constant $\tau$ is controlled in large part by the thermal conduction mechanism and $\tau$ is therefore substantially independent of atmospheric changes, attitude, acceleration, and vibration.

Analysis of the wave form of FIG. 9 will lead to the conclusion that the amplitude of the fundamental component varies as the thermal time constant $\tau$ and the cooling rate are changed. Since, by the action of narrow band filter 59 of FIG. 7, this fundamental frequency is the parameter used to sense the gain of the radiometer system, a change in the amplitude of the fundamental component causes an erroneous variation of the over-all system gain so that the system loses its calibration. Nearly all of the error results from the change in the cooling rate.

The benefits of the configurations of FIGS. 4, 5, and 6 arise in part from the subminiature construction allowing rapid response of microresistor 7 to small changes in the input power level and proper matching to transmission line 18 and to capacitive plate 4. The flared interface elements 34, 34a tend to concentrate the control current from bias control 20 in the immediate vicinity of the center 42 of microresistor active portion 38. This is accordingly the location of maximum temperature change and is thus desirably the compact site of generation of the major part of the noise power. The capacitive plate 4 places, in effect, a transverse reflecting element at point 42 so that flow of noise energy into the flared or arcuate sector 34 and plate 4 is forbidden; all noise energy flows efficiently as a circular front wave into strip transmission line 18, where a lineal front wave is promptly perforce substituted. Furthermore, the flared sections 34, 34a act to control the flow of heat in and out of the microresistor active portion 38 so that its temperature rises and falls rapidly due to the wave train of FIG. 8 and yet exhibits a relatively large stable swing from $T_{MIN}$ to $T_{MAX}$ for a given power input. The thickness of gold layer 31 is beneficially controlled for the same reason, is used to cover much of tantalum layer 32 because of its low electrical and thermal resistance, and is beneficially resistant to corrosion. The capacity plate 4 provides a matched electrical termination for microresistor system 7, being a radial strip transmission line, open circuited at its curved periphery. Furthermore, capacity plate 4 forms a major part of the heat sink for heat generated in microresistor 7.

Accordingly, it is seen that the invention is a reference signal generator and radiometric reference system for use in radiometer apparatus and permitting rapid and precise over-all gain control of the radiometer receiver. The noise reference generator operates by cyclic modulation of the temperature of a novel planar thin-film microresistor disposed in a constant temperature environment and overcoming the difficulties of the prior art through cooperating thermal and high frequency design features of the microresistor. The noise generating microresistor temperature and rate of change of temperature are stabilized, the resistor being cooled by conduction, and are therefore independent of varying ambient temperature, of atmospheric pressure (or altitude), and of acceleration, vibration, and attitude.

The thin and therefore fragile wire and the supporting leads of the Wilt device and their inherent relatively high impedance and consequent matching problems are eliminated in the inherently rigid broad band width microresistor system. The structure of the thin film device lends itself to conventional microcircuit manufacturing techniques, readily enabling its thermal capacity to be limited and its thermal resistance to be controlled.

While the invention has been described in its preferred embodiments, it is to be understood that the words which have been used are words of description rather than of limitation and that changes within the purview of the appended claims may be made without departure from the true scope and spirit of the invention in its broader aspects.

What is claimed is:

1. In transmission line apparatus for generating broad band noise signals:
    substrate means having at least a first surface,
    transmission line means affixed to said first surface and having at least a first end,
    capacitive plate means affixed to said first surface opposite said first end,
    thin film microresistor noise generator means coupled to said capacitive plate means and in matched energy exchanging relation with said first end,
    said thin film noise generator means being affixed to said first surface, and
    generator means coupled across said thin film microresistor noise generator means for cyclically heating same.

2. Apparatus as described in claim 1 wherein said thin film microresistor noise generator means comprises resistive metal film means extending continuously also beneath said transmission line means and said capacitive plate means in bonded relation with said substrate means.

3. Apparatus as described in claim 2 wherein said resistive metal film is formed of a metal selected from the class of metals consisting of tantalum, rhodium, chromium, titanium, and platinum and alloys thereof.

4. Apparatus as described in claim 2 wherein said transmission line means and said capacitive plate means comprise discrete electrically conductive metal layers affixed to said resistive metal film means and disposed on opposed sides of said thin film microresistor means.

5. Apparatus as described in claim 4 wherein said discrete electrically conductive layers provide flared electrical impedance matching sections at each side of said thin film microresistor noise generator means.

6. Apparatus as described in claim 1 wherein said transmission line means and said capacitive plate means are formed by first electrically conductive metal layers of a first thickness and include opposed concave arc-shaped boundaries, said thin film microresistor noise generator means further including:
    impedance matching means comprising discrete opposed flared arcuate sector shaped layers of a second thickness, one each disposed in thermal and electrical conducting relation at said respective opposed arc-shaped boundaries at each side of said thin film microresistor noise generator means,
    said thin film microresistor noise generator means additionally comprising a layer of a third thickness of electrically resistive material bonded to said substrate means and extending everywhere under said impedance matching means, said transmission line means, and said capacitive plate means.

7. Apparatus as described in claim 1 wherein said transmission line means comprises strip transmission line means for coupling said broad band noise signals into radiometer receiver means.

8. Apparatus as described in claim 7 wherein said transmission line means includes means for blocking passage of direct current signals into said radiometer receiver means.

9. Apparatus as described in claim 6 wherein said first thickness is greater than said second thickness and said second thickness is greater than said third thickness.

10. Apparatus as described in claim 1 wherein said transmission line means comprises strip transmission line means, said apparatus further including: first flared impedance matching means coupling said first
  end to said thin film microresistor noise generator means,
    said thin film microresistor noise generator means having a width less than the width of said strip transmission line means, and
  second flared impedance matching means coupling said capacitive plate means to said thin film microresistor noise generator opposite said first flared impedance matching means,
  said first and second flared impedance matching means serving cooperatively to concentrate heating of said thin film microresistor noise generator means substantially at its geometric center, and
  said capacitive plate means and said first and second flared impedance matching means serving cooperatively with said strip transmission line means to conduct heat from said thin film microresistor noise generator means into said substrate acting as a constant temperature heat sink, and additionally to promote efficient one-way flow of said broad band noise signals substantially from said geometric center along said strip transmission line means.

11. Apparatus as described in claim 1 further including ground plate electrical conductor means affixed to a second surface of said substrate means in energy propagating relation at least with said transmission line means.

12. Apparatus as described in claim 1 wherein:
  said capacitive plate means comprises first and second capacity plates affixed on said surface substantially symmetrically with respect to said transmission line means,
  said thin film microresistor noise generator means comprises first and second thin film microresistors coupled to said respective capacity plates,
    said thin film microresistors being coupled to said transmission line means end, and
  said thin film microresistors each being characterized by impedances substantially twice that of said transmission line means.

13. Apparatus as described in claim 12 wherein said generator means is coupled to said first and second capacity plates for providing control current flow through said first capacity plate, said first thin film microresistor, said second thin film microresistor, and said second capacity plate back into said generator means.

14. Apparatus as described in claim 6 further including heater means coupled to said surface and substantially encompassing said thin film microresistor noise generator means for maintaining constant the effective ambient temperatures thereof.

* * * * *